(12) United States Patent
Garcia et al.

(10) Patent No.: US 9,775,256 B2
(45) Date of Patent: Sep. 26, 2017

(54) SEALING SYSTEM AND METHOD FOR SEALING OF ELECTRONICS HOUSINGS

(71) Applicant: MOTOROLA SOLUTIONS, INC., Schaumburg, IL (US)

(72) Inventors: Jorge L. Garcia, Plantation, FL (US); Patrick S. Claeys, Pembroke Pines, FL (US)

(73) Assignee: MOTOROLA SOLUTIONS, INC., Chicago, IL (US)

(*) Notice: Subject to any disclaimer, the term of this patent is extended or adjusted under 35 U.S.C. 154(b) by 53 days.

(21) Appl. No.: 14/886,568

(22) Filed: Oct. 19, 2015

(65) Prior Publication Data
US 2017/0112003 A1   Apr. 20, 2017

(51) Int. Cl.
*H05K 5/02* (2006.01)
*H05K 5/00* (2006.01)
*F16J 15/02* (2006.01)

(52) U.S. Cl.
CPC .......... *H05K 5/0052* (2013.01); *F16J 15/022* (2013.01); *H05K 5/0004* (2013.01); *H05K 5/0243* (2013.01); *H05K 5/0247* (2013.01)

(58) Field of Classification Search
CPC ..... H05K 5/0052; H05K 5/0243; F16J 15/022
See application file for complete search history.

(56) References Cited

U.S. PATENT DOCUMENTS

| 4,623,391 A | 11/1986 | Seitz |
| 5,223,996 A | 6/1993 | Read et al. |
| 5,804,762 A * | 9/1998 | Jones ................ H05K 9/0015 174/358 |

(Continued)

FOREIGN PATENT DOCUMENTS

| CN | 202617561 | 12/2012 |
| CN | 204014352 | 12/2014 |

(Continued)

OTHER PUBLICATIONS

Combined Search and Examination Report from the Intellectual Property Office of Great Britain for Application No. 1616109.3 dated Feb. 17, 2017 (8 pages).

*Primary Examiner* — Hoa C Nguyen
*Assistant Examiner* — Keith Depew
(74) *Attorney, Agent, or Firm* — Michael Best & Friedrich LLP

(57) ABSTRACT

A sealing system for sealing an electronics housing includes, in one example, a one-piece sealing member that seals the perimeter surface of an electronics substrate disposed within the electronics housing. The one-piece sealing member includes a perimeter seal portion that engages the perimeter substrate, a first seal portion that engages a first substrate surface and a second seal portion that engages a second substrate surface of the electronics substrate. The one-piece sealing member also includes a pocket that engages and seals an input and output component adjacent to the electronics substrate, such as an audio connector or Universal Serial Bus connector. The perimeter seal portion of the one-piece sealing member may also include a translucent section that allows light from a light emitting diode to be emitted through the one-piece sealing member.

18 Claims, 6 Drawing Sheets

(56) References Cited

U.S. PATENT DOCUMENTS

| | | | | |
|---|---|---|---|---|
| 7,173,826 B1* | 2/2007 | Chiou | ................ | H05K 5/0269 |
| | | | | 361/715 |
| 7,852,601 B1* | 12/2010 | Little | ................ | G11B 33/1466 |
| | | | | 360/99.22 |
| 8,014,158 B2* | 9/2011 | Kojima | ................ | H05K 5/0052 |
| | | | | 174/50.5 |
| 8,439,191 B1 | 5/2013 | Lu | | |
| 8,942,001 B2* | 1/2015 | Kawai | ................ | H05K 5/0052 |
| | | | | 174/50.5 |
| 9,281,607 B2* | 3/2016 | Lee | ................ | H01R 13/5202 |
| 9,450,346 B1* | 9/2016 | Garcia | ................ | H01R 13/521 |
| 9,462,715 B2* | 10/2016 | Nuriya | ................ | H05K 5/061 |
| 9,491,338 B1* | 11/2016 | Garcia | ................ | H04N 5/2252 |
| 2004/0089570 A1* | 5/2004 | Chien | ................ | H04M 1/18 |
| | | | | 206/320 |
| 2005/0195581 A1* | 9/2005 | Chiou | ................ | H05K 5/0269 |
| | | | | 361/752 |
| 2009/0068862 A1* | 3/2009 | Honda | ................ | H05K 5/0052 |
| | | | | 439/78 |
| 2011/0256777 A1* | 10/2011 | Schober | ................ | H05K 5/0039 |
| | | | | 439/660 |
| 2012/0320544 A1* | 12/2012 | Ohhashi | ................ | H05K 5/0052 |
| | | | | 361/752 |
| 2013/0210256 A1* | 8/2013 | Hosokawa | ................ | H05K 5/0052 |
| | | | | 439/278 |
| 2014/0198435 A1 | 7/2014 | Yeh et al. | | |
| 2016/0254612 A1* | 9/2016 | Andrei | ................ | H01R 13/5202 |

FOREIGN PATENT DOCUMENTS

| | | |
|---|---|---|
| EP | 3090854 | 11/2016 |
| JP | 2013179355 | 9/2013 |

* cited by examiner

SEALING SYSTEM AND METHOD FOR SEALING OF ELECTRONICS HOUSINGS

BACKGROUND OF THE INVENTION

Electronic devices, for example, mobile telephones, two-way radios, laptop computers, and music players, include housings that hold and protect the circuits, electronics, and other internal components of the electronic device (an "electronics housing"). It is often desirable to seal the housings to reduce or prevent contamination of the internal components from environmental elements such as dust and moisture. Achieving a suitable seal, however, can be challenging because electronic devices often include various connectors, displays, and actuators that are accessible outside of the housing but nonetheless interact with the internal components within the housing.

Some conventional housing designs use a double wall or a thick single wall, in combination with radial and compression sealing members, to seal the electronics housing from environmental elements. When attempting to maintain a certain overall size of an electronic device, use of a double or a thick wall consumes valuable space. As a consequence, in some cases it is necessary to reduce the size of printed circuit boards, electronics substrates, and other components within the housing so that the overall size of the electronic device remains within design requirements. In other instances, the accommodation of such sealing arrangements grows the overall size of the electronic device. In addition, these sealing arrangements are not always effective in protecting internal components from environmental elements.

There are other deficiencies and disadvantages of some conventional sealing mechanisms. In some instances, achieving a suitable seal with conventional sealing mechanisms requires the addition of numerous steps to the manufacturing process of the electronic device. In other instances, conventional sealing mechanisms are complex, particularly with respect to the manner in which the sealing of connectors and actuators is addressed. In some instances, components of the electronic device are over molded, and separate seals are then assembled with exterior connectors, displays, and actuators. In addition, some traditional sealing mechanisms impose limitations on the placement of some displays and actuators.

Accordingly, there is a need for an improved sealing method and seal system for electronics housings.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
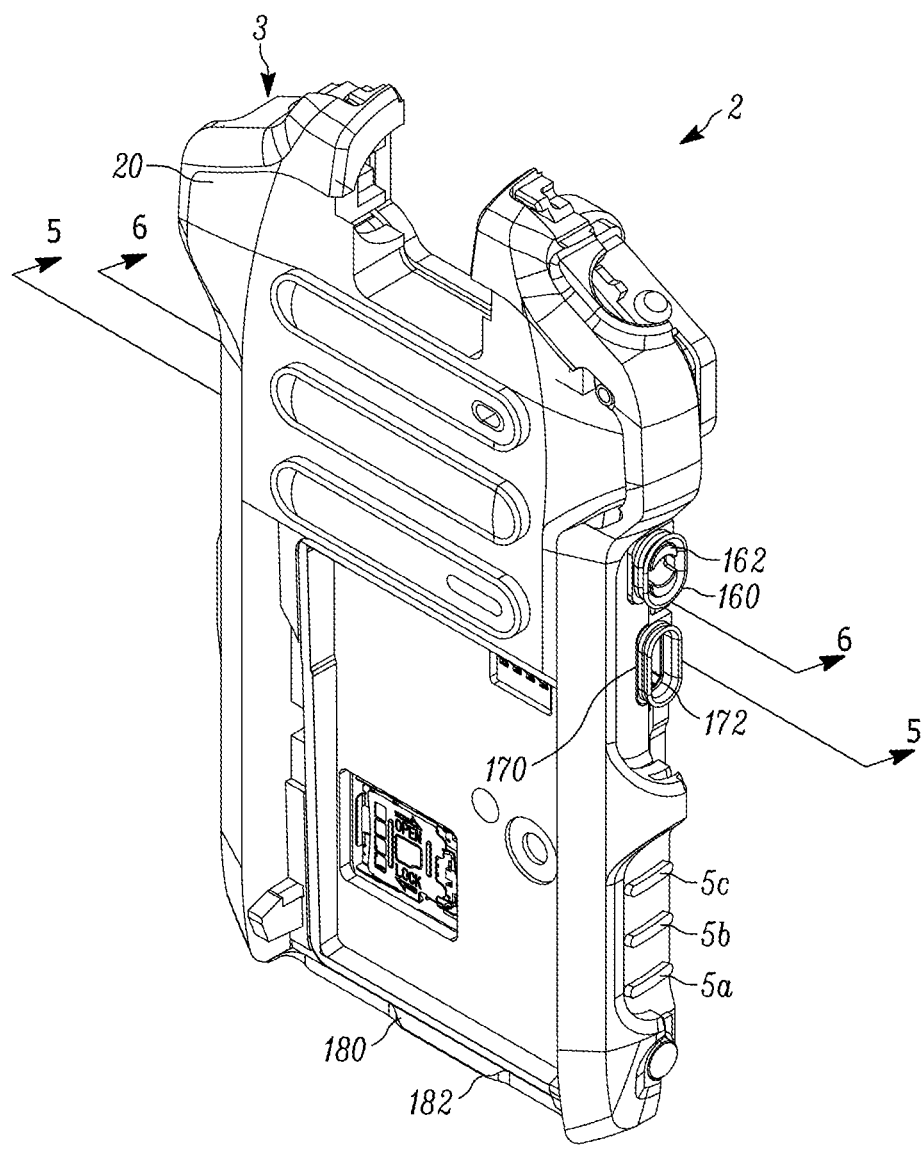
FIG. 1 is a first perspective view of an electronic device incorporating one exemplary embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One exemplary embodiment provides a sealing structure for an electronics substrate disposed in electronics housing. In one example, the sealing structure includes a one-piece sealing member that is configured to engage a perimeter surface of the electronics substrate. The one-piece sealing member has a perimeter seal portion that is configured to engage the perimeter surface of the electronics substrate. The one-piece sealing member also includes a first seal portion that is configured to engage a first substrate surface of the electronics substrate, and a second seal portion that is configured to engage a second substrate surface of the electronics substrate.

Figure 2:
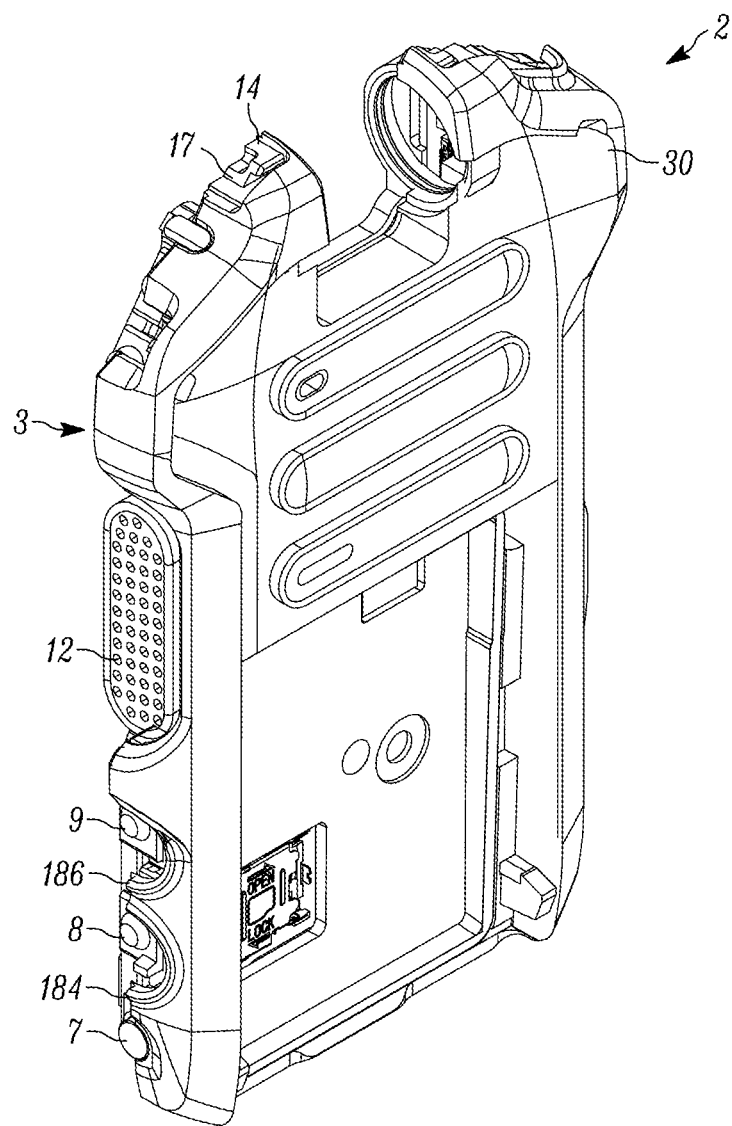
FIG. 2 is a second perspective view of the electronic device of FIG. 1.
Figure 3:
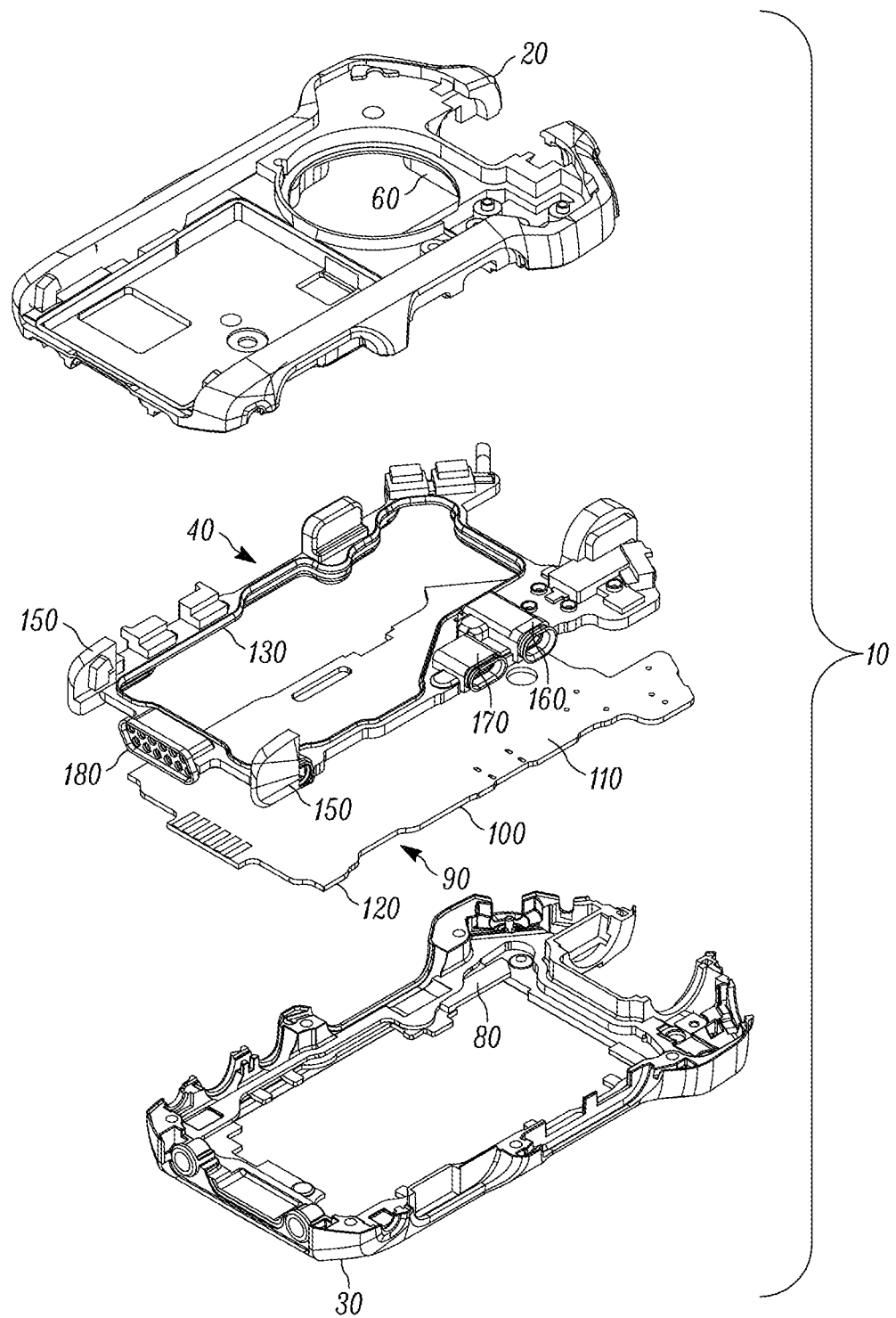
FIG. 3 is an exploded view of a sealing system in accordance with some embodiments.

FIGS. 1 and 2 depict an electronic device 2 that incorporates an exemplary embodiment. In FIGS. 1 and 2, electronic device 2 is a two-way radio, but it could be any of a wide variety of devices, including a mobile telephone, a tablet computer, a music player, a diagnostic or testing device, or another device. Referring to FIGS. 1, 2, and 3, electronic device 2 has an electronics housing 3 and a plurality of input and output components, some of which are disposed adjacent to one-piece sealing member 40 (shown in FIG. 3). The input and output components can include, for example, various actuators, buttons, switches, connectors, antennas, and light emitting diodes. The connectors may include, for example, audio connectors, Universal Serial Bus (USB) connectors, and video connectors such as Video Graphics Array (VGA) and High-Definition Multimedia Interface (HDMI) connectors. Other input and output components could also be used. It should be understood that the term "input and output component" is used herein to refer to devices or components that are input devices or components (that is, receiving input into the electronic device 2), output devices or components (that is, provide output from the electronic device 2), or both. "Input and output component" is not limited to devices or components that perform both input and output functions.

Figure 4:
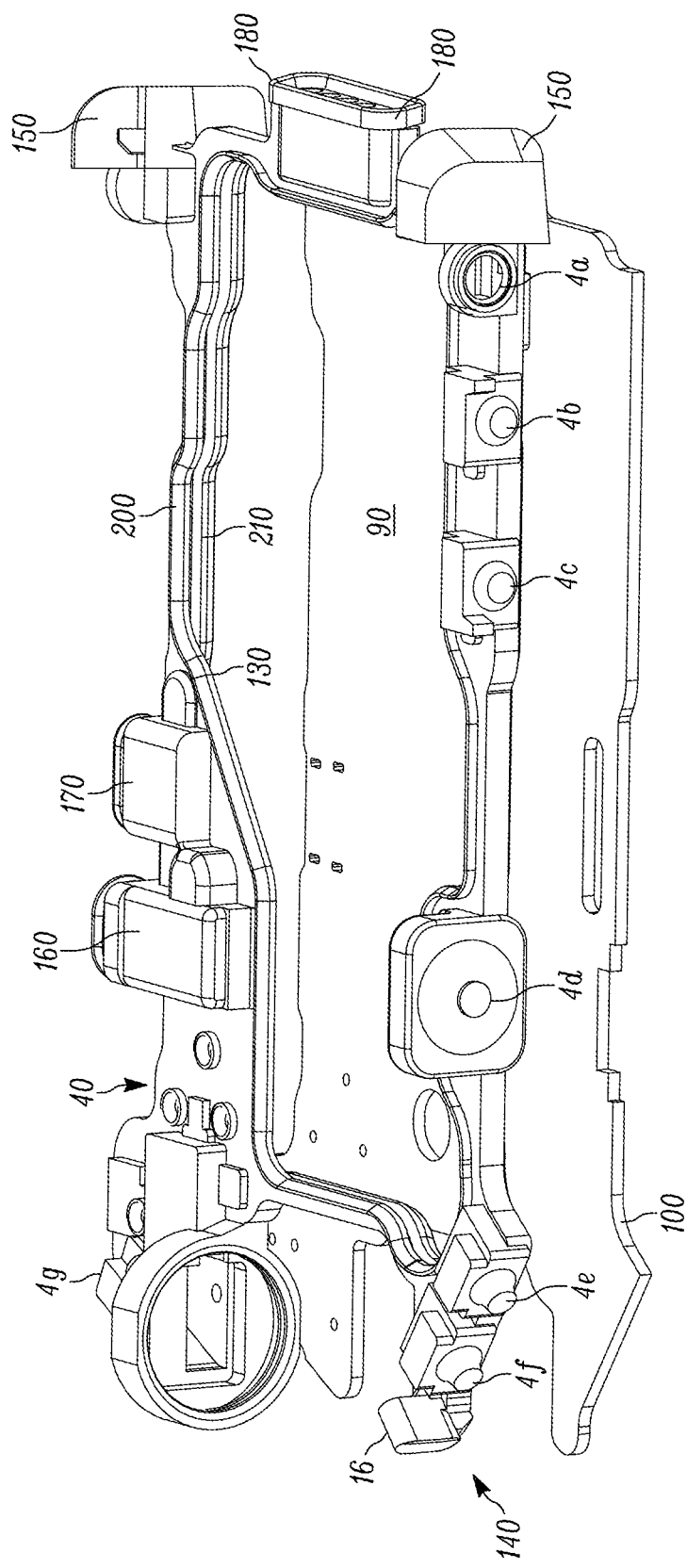
FIG. 4 illustrates a one-piece sealing member and electronics substrate in accordance with some embodiments.

As may be seen by reference to FIGS. 1 and 2, the input and output components may include first button 7, second button 8, third button 9, and push-to-talk (PTT) button 12 disposed adjacent to actuator pocket 4a (shown in FIG. 4) and flexible actuator portions 4b, 4c, and 4d, respectively (also shown in FIG. 4). One-piece sealing member 40 also includes flexible actuator portions 4e, 4f, and 4g (also shown in FIG. 4) which are adjacent to respective buttons. The flexible actuator portions 4e, 4f, and 4g are formed integral with the perimeter seal portion 130 of one-piece sealing member 40. The flexible actuator portions 4b through 4g act as force concentrators when pressed, which cause their respective actuators to be activated while at the same time sealing the actuators from the environment.

The plurality of input and output components also includes buttons 5a, 5b, 5c (shown in FIG. 1). The electronic device 2 also includes a light emitting diode 14 (shown in FIG. 2) disposed in a light guide pocket 16 (shown in FIG. 4) formed integral with one-piece sealing member 40. Light guide pocket 16 acts as a light guide for light emitting diode 14. In some embodiments, light guide pocket 16 may be fully or partially translucent. In addition, one-piece sealing member 40 may have a translucent section 17 (shown in FIG. 2) to partially diffuse the light from a point light source like a light emitting diode.

FIG. 3 is an exploded view of a sealing system 10 according to one embodiment. In FIG. 3, the sealing system 10 includes a first housing section 20, a second housing section 30, one-piece sealing member 40, and an electronics substrate 90. First housing section 20 and second housing section 30 are components of electronics housing 3 (FIG. 1). In FIG. 3, first housing section 20 includes a first interior surface 60. The second housing section 30 has a second interior surface 80. In some embodiments and for cosmetic purposes, one-piece sealing member 40 may be formed from a different color than at least one of first housing section 20 and second housing section 30. Electronics substrate 90 is disposed between the first housing sections 20 and second housing section 30. Electronics substrate 90 has a perimeter surface 100, a first substrate surface 110, and a second substrate surface 120 that is opposite to first substrate surface 110. One-piece sealing member 40 has a perimeter seal portion 130 that engages the perimeter surface 100 of electronics substrate 90.

FIG. 4 depicts a sealing structure 140 that includes one-piece sealing member 40. As shown in FIG. 4, one-piece sealing member 40 has a perimeter seal portion 130 that is disposed around and engages perimeter surface 100 of electronics substrate 90. One-piece sealing member 40 also includes integrally-formed, extended bumper portions 150 which are configured to absorb shocks during impacts to the electronic device 2 if dropped.

Referring again to FIG. 4, one-piece sealing member 40 also includes first pocket 160, second pocket 170, and third pocket 180 that seal input and output components located adjacent to electronics substrate 90. First pocket 160 is configured to be disposed around and to seal a first input and output component 162 (FIG. 1). Second pocket 170 is configured to be disposed around and to seal a second input and output component 172 (FIG. 1). Third pocket 180 is configured to be disposed around and to seal a third input and output component 182 (FIG. 1). More or fewer input and output components and pockets can be used. Examples of input and output components that can be sealed with pockets include the actuators, buttons, switches, antennas, connectors, and light emitting diodes mentioned above. Other types of input and output components may be used, and one-piece sealing member 40 can include pockets which are specifically configured to engage and seal against these types of input and output components. For example, the pocket can be configured to seal a chip antenna positioned near the perimeter of electronics substrate 90. Also, an electrical trace antenna may be disposed near the perimeter surface 100 of electronics substrate 90 and, thus, be disposed adjacent to perimeter seal portion 130 of one-piece sealing member 40.

Figure 5:
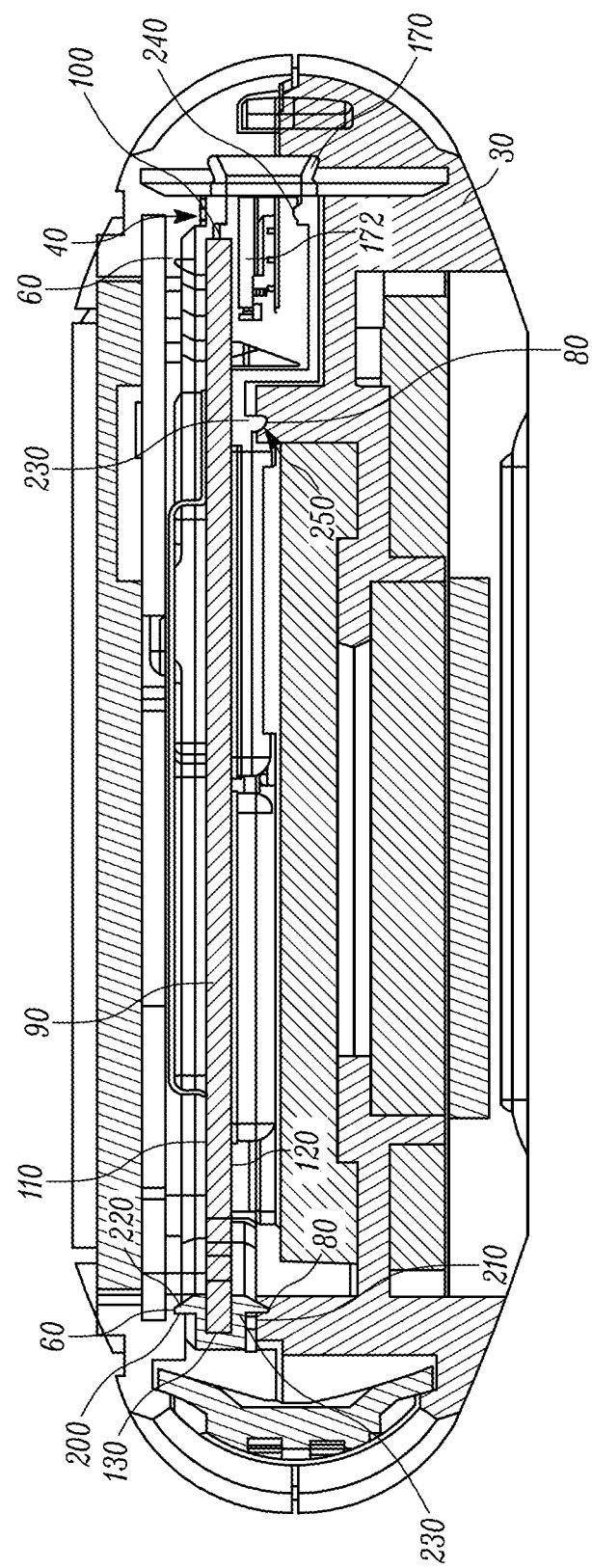
FIG. 5 is a cross-section of the electronic device of FIG. 1, taken along line 5-5 of FIG. 1.

FIG. 5 is a cross-sectional view of electronic device 2, taken along line 5-5 of FIG. 1. As noted above, the perimeter seal portion 130 of one-piece sealing member 40 engages perimeter surface 100 of electronics substrate 90. One-piece sealing member 40 also includes a first seal portion 200 that engages first substrate surface 110, and a second seal portion 210 that engages second substrate surface 120. First seal portion 200 includes a first compression member 220 that engages the first interior surface 60 of first housing section 20. First compression member 220 and first interior surface 60 together form a first compression seal. First compression member 220 is angled toward perimeter seal portion 130 so that first compression member 220 deforms in a direction toward the perimeter seal portion 130. Beneficially, additional pressure on electronics housing 3, such as water pressure, will cause more deformation of first compression member 220 and improved compression sealing with first interior surface 60. This type of seal is referred to as a sympathetic seal.

Again referring to FIG. 5, second seal portion 210 includes a second compression member 230 that engages second interior surface 80 of second housing section 30. Second compression member 230 and second interior surface 80 together form a second compression seal. Second compression member 230 is angled toward perimeter seal portion 130 so that second compression member 230 deforms in a direction toward perimeter seal portion 130. Beneficially, additional pressure on electronics housing 3 will cause more deformation of second compression member 230 and improved compression sealing with second housing section 30.

FIG. 5 also depicts a cross section of second pocket 170. In FIG. 5, second pocket 170 is integrally-formed with one-piece sealing member 40. Second pocket 170 is disposed around a second input and output component 172, which in the illustrated embodiment is a female connector. Second pocket 170 includes an inner annular lip 240 configured to engage and seal against a male connector when the male connector is connected to the female connector. Inner annular lip 240 provides additional sealing of second pocket 170. Second pocket 170 also includes a pocket seal 250 disposed radially-inward from the perimeter seal portion 130 that provides additional compression sealing. As shown in FIG. 5, pocket seal 250, which is part of second seal portion 210, has a second compression member 230 that is angled toward perimeter seal portion 130 so that additional pressure on electronics housing 3 will cause additional deformation of second compression member 230 in the direction toward perimeter seal portion 130 when pocket seal 250 compresses against first interior surface 60 of first housing section 20 for improved compression sealing under pressure.

Figure 6:
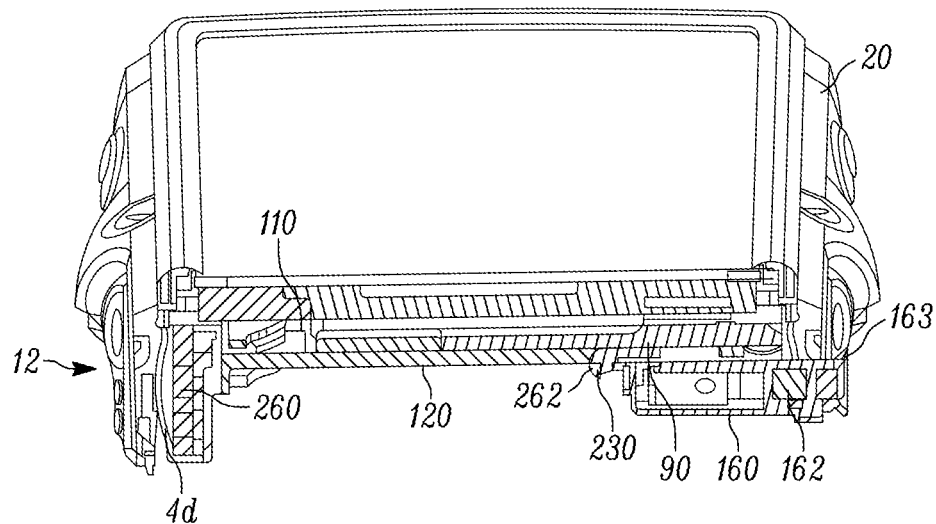
FIG. 6 is a cross-section of the electronic device of FIG. 1, taken along line 6-6 of FIG. 1.

FIG. 6 is a cross section of the electronic device 2 of FIG. 1, taken along line 6-6 of FIG. 1. In FIG. 6, one-piece sealing member 40 includes flexible actuator portion 4d formed integral with perimeter seal portion 130 of one-piece sealing member 40. Flexible actuator portion 4d is adjacent to push-to-talk button 12. When push-to-talk button 12 is depressed, it causes flexible actuator portion 190 to press against actuator 260 to activate the actuator 260. In this manner, actuator 260 is sealed against the environment while still being functional.

FIG. 6 also depicts a first pocket 160 enclosing a first input and output component 162, which in the illustrated embodiment is a female connector. First pocket 160 includes an outwardly-extending shroud 163 that provides additional protection against the environment. Pocket seal 262 is disposed radially-inward from perimeter seal portion 130, and also has a second compression member 230 that is angled toward perimeter seal portion 130 for improved sealing with second housing section 30 under increased outside pressure.

Figure 7:
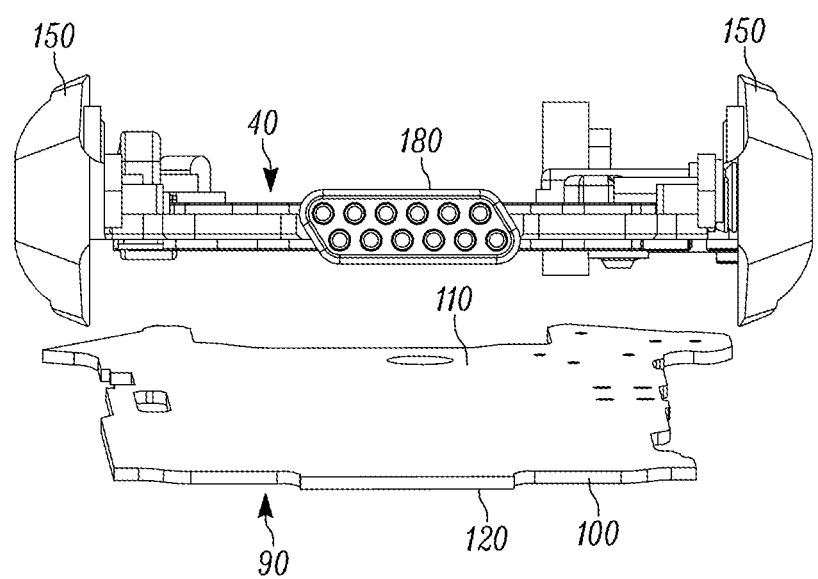
FIG. 7 is an end view of a one-piece sealing member, an electronics substrate, and a second housing section in accordance with some embodiments.

FIG. 7 is an end view of one-piece sealing member 40, electronics substrate 90, and second housing section 30. As shown in FIG. 7, one-piece sealing member 40 includes extended bumper portions 150 and a third pocket 180 that is disposed around the perimeter of a third input and output component 182, which is a multi-pin connector (FIG. 1). Third pocket 180 also seals the pins of third input and output component 182.

Another embodiment provides a method for sealing an electronics housing 3. As shown in FIGS. 3 through 6, the perimeter seal portion 130 of one-piece sealing member 40 is disposed such that it engages the perimeter surface 100 of electronics substrate 90. The first substrate surface 110 of electronics substrate 90 engages a first seal portion 200 of the one-piece sealing member 40, and the second substrate surface 120 engages the second seal portion 210 of the one-piece sealing member 40. The electronics substrate 90, the electronics housing 3 (including first housing section 20 and second housing section 30), and the one-piece sealing member 40 are coupled to form a seal of electronics substrate 90. To provide compression sealing, a first compression seal is formed using a first compression member 220 of first seal portion 200 that engages a first interior surface 60 of the electronics housing 3. Also, second compression member 230 of second seal portion 210 engages a second interior surface 80 of electronics housing 3 to form a second compression seal. The one-piece sealing member 40 is wrapped around the electronics substrate 90 and captures the electronics substrate 90, which aides in assembly and sealing of the electronics housing 3.

The method includes integrally-forming one or more pockets with the one-piece sealing member 40 that engage and seal respective input and output components. The method includes forming lips on inner annular surfaces of the pockets to seal against connectors which are connected to the input and output components.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . , a" "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10 percent, in another embodiment within 5 percent, in another embodiment within 1 percent and in another embodiment within 0.5 percent. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A sealing structure for an electronics substrate disposed in an electronics housing, comprising:
   a one-piece sealing member configured to engage a perimeter surface of the electronics substrate, the one-piece sealing member including
      a perimeter seal portion configured to engage the perimeter surface of the electronics substrate;
      a flexible actuator portion formed integral with the perimeter seal portion;
      a first seal portion configured to engage a first substrate surface of the electronics substrate; and
      a second seal portion configured to engage a second substrate surface of the electronics substrate.

2. The sealing structure of claim 1, wherein at least one of the first seal portion and the second seal portion is angled toward the perimeter seal portion.

3. The sealing structure of claim 1, wherein the first seal portion includes a first compression member.

4. The sealing structure of claim 3, wherein the second seal portion includes a second compression member.

5. The sealing structure of claim 1, wherein the one-piece sealing member further comprises:
   a pocket configured to engage a input and output component.

6. The sealing structure of claim 5, wherein the pocket includes a lip configured to engage a connector.

7. The sealing structure of claim 5, wherein the pocket includes a pocket seal disposed radially inward from the perimeter seal portion.

8. The sealing structure of claim 1, wherein the perimeter seal portion includes a translucent section.

9. The sealing structure of claim 1, wherein the one-piece sealing member includes at least one extended bumper portion.

10. A sealing system for sealing an electronics housing, comprising:
- a first housing section having a first interior surface;
- a second housing section having a second interior surface;
- an electronics substrate disposed between the first housing section and the second housing section, the electronics substrate having a perimeter surface, a first substrate surface, and a second substrate surface opposite the first substrate surface;
- an actuator adjacent to the electronics substrate; and
- a one-piece sealing member that engages the electronics housing, including
  - a perimeter seal portion that engages the perimeter surface of the electronics substrate;
  - an actuator portion, formed integral with the perimeter seal portion, that engages the actuator;
  - a first seal portion that engages the first substrate surface of the electronics substrate; and
  - a second seal portion that engages the second substrate surface of the electronics substrate.

11. The sealing system of claim 10, wherein at least one of the first seal portion and the second seal portion is angled toward the perimeter seal portion.

12. The sealing system of claim 10, wherein the first seal portion includes a first compression member that forms a first compression seal with the first interior surface of the first housing section.

13. The sealing system of claim 10, further comprising:
- an input and output component adjacent to the electronics substrate; and
wherein the one-piece sealing member includes a pocket that engages the input and output component.

14. The sealing system of claim 13, wherein the pocket includes a lip configured to engage a connector that is connected to the input and output component.

15. The sealing system of claim 10, wherein the perimeter seal portion includes a translucent section.

16. The sealing system of claim 10, wherein the one-piece sealing member is made from a different color than at least one of the first housing section and the second housing section.

17. The sealing system of claim 10, wherein the one-piece sealing member includes at least one extended bumper portion.

18. A method for sealing an electronics housing, the electronics housing having an electronics substrate, comprising:
- disposing a perimeter seal portion of a one-piece sealing member in to engage a perimeter surface of the electronics substrate, the perimeter seal portion including an integrally-formed flexible actuator portion;
- engaging a first substrate surface of the electronics substrate with a first seal portion of the one-piece sealing member;
- engaging a second substrate surface of the electronics substrate with a second seal portion of the one-piece sealing member; and
- coupling the electronics substrate, the electronics housing and the one-piece sealing member.

* * * * *